United States Patent [19]

Awakowicz et al.

[11] Patent Number: 4,754,533

[45] Date of Patent: Jul. 5, 1988

[54] RETAINING CLIP FOR FASTENING A FLAP COMPONENT PART TO A HOUSING PART

[75] Inventors: Erwin Awakowicz, Munich; Peter Kleine, Fischen; Karin Thum, Munich, all of Fed. Rep. of Germany

[73] Assignee: Siemens Aktiengesellschaft, Berlin and Munich, Fed. Rep. of Germany

[21] Appl. No.: 7,491

[22] Filed: Jan. 28, 1987

[30] Foreign Application Priority Data

Feb. 18, 1986 [DE] Fed. Rep. of Germany ....... 3605143

[51] Int. Cl.$^4$ .............................................. G12B 9/00
[52] U.S. Cl. ....................................... 24/458; 24/297; 248/27.3
[58] Field of Search ................ 248/27.3; 24/297, 458, 24/573, 67.11, 530, 560, 294, 295

[56] References Cited

U.S. PATENT DOCUMENTS

| | | | |
|---|---|---|---|
| 2,596,438 | 5/1952 | Rollings | 24/458 X |
| 3,041,693 | 7/1962 | Simon, Jr. et al. | 24/573 X |
| 3,102,728 | 9/1963 | Booth | 24/67.11 X |
| 3,195,253 | 7/1965 | White | 24/67.11 X |
| 3,368,780 | 2/1968 | Buttriss | 248/27.3 |
| 4,401,323 | 8/1983 | Rex | 24/67.11 X |
| 4,453,471 | 6/1984 | Harrington et al. | 24/458 X |

FOREIGN PATENT DOCUMENTS

| | | | |
|---|---|---|---|
| 2856493 | 7/1979 | Fed. Rep. of Germany | 24/458 |
| 947385 | 1/1964 | United Kingdom | 24/295 |

*Primary Examiner*—Kenneth J. Dorner
*Assistant Examiner*—James R. Brittain
*Attorney, Agent, or Firm*—Hill, Van Santen, Steadman & Simpson

[57] ABSTRACT

Fastening of flat component parts to a housing part by means of retaining clips is provided. This procedure should proceed quickly and without the assistance of a tool.

To this end, the appertaining retaining clip is angularly fashioned and has its one leg engaging within a shaft-like receptacle. This leg lies partially against a wall of the housing part, whereas the other leg is supported against the component part under pre-tension.

8 Claims, 1 Drawing Sheet

RETAINING CLIP FOR FASTENING A FLAP COMPONENT PART TO A HOUSING PART

BACKGROUND OF THE INVENTION

1. Field of the Invention

The invention comprises a retaining clip for fastening flat component parts, particularly circuit boards or displays, to a housing part.

2. Description of the Prior Art

The fastening of printed circuit boards or displays to housing parts, particularly within telephone stations, usually ensues by screwing to housing parts or plugging into retaining frames or clips which are in turn held in corresponding receptacles within the housing.

SUMMARY OF THE INVENTION

An object of the present invention is to provide a fastening of a flat component part to a housing part which can be quickly and easily carried out without the assistance of tools.

This object is achieved in that the retaining clip is angularly designed, whereby its one leg engages within a shaft-like receptacle in the housing part and is partially supported against a wall of the housing part, whereas the other leg is seated against the flat component part under pre-tension.

Such a design of the retaining clip enables a problem-free fastening of the corresponding component part by simple engagement of a leg of the retaining clip within the shaft-like receptacle in the housing part, whereby this leg is simultaneously supported against a wall of the housing part and the other leg exerts the pressure on the component part that is required for holding the component part. Releasing the fastening thereby ensues by simply neutralizing the latch connection between the leg of the retaining clip comprising a latch hook and the cooperating latch in the shaft-like receptacle.

The application of the retaining clip can be facilitated in that the leg pressing against the component part has a shoulder in its region facing toward the component part, this shoulder being connected to the leg of one piece and preferably comprising a round or crowned contour at its free end. As a result of this design of the shoulder, only a point-like or line-like contact of the leg with the component part ensues, so that the friction between the parts can be considerably reduced. Too great an unbending of the legs during the fastening procedure can further be avoided in a simple way by providing a reinforcing rib between the two legs.

BRIEF DESCRIPTION OF THE DRAWINGS

The invention shall be set forth in greater detail below with reference to an exemplary embodiment. Shown are.

DESCRIPTION OF THE PREFERRED EMBODIMENTS

Figure 1:
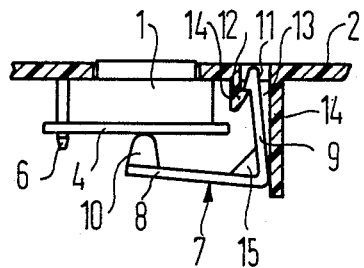
FIG. 1 is the mounting of a display in a telephone station in a partially cut side view.
Figure 2:
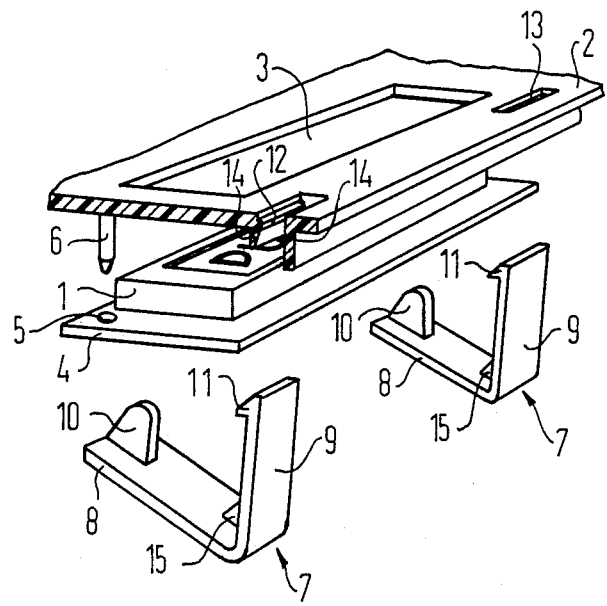
FIG. 2 is an exploded perspective view of the arrangement of FIG. 1.

A display 1 for displaying characters in the form of letters or numerals should be secured within a telephone housing, preferably at the upper housing part 2 of a telephone station.

The upper housing part 2 includes a recess 3 into which the see-through vision panel of the display 1 projects. A printed circuit board 4 carrying electrical components is also secured to the display 1, this printed circuit board 4 having at least one bore 5 into which a centering pin 6 engages for the purpose of easier mounting.

The fastening of the display 1 ensues by means of two angular retaining clips 7 whose legs 8 and 9 are arranged at an angle of less than 90° relative to one another. The free end of the leg 8 is integrally connected to a shoulder 10 having an arcshape in its end region, whereas the free end of the leg 9 includes a latch hook 11. This latch hook 11 at the leg 9 engages with a cooperating latch element 12 at the upper part 2 of the housing. This cooperating latch element 12 projects into a shaft-like receptacle 13 in the upper part 2 of the housing. In the region lying opposite the cooperating latch element 12, the receptacle 13 is bounded by a wall 14 connected to the upper part 2 of the housing. The wall 14 has a length longer than the leg 9 of the retaining clip. The wall 14 thus forms a seat for the retaining clip whose leg 9 includes the shoulder 10 presses against the printed circuit board 4 connected to the display, pressing thereagainst with a slight pre-tension. In order to prevent too great unbending of the retaining clip, a reinforcing rib 15 is arranged in the connecting region of the two legs 8 and 9.

Whereas the fastening of the display 1 ensues by pressing the leg 9 into the receptacle 13 comprising the cooperating latch element, whereby one region of the leg 9 presses against the wall and the other leg 8 has its shoulder 10 pressing against the printed circuit board 4, releasing the latch connection is undertaken by means of a lever-like tool, for example a screwdriver, with which the latch hook 11 is pressed away from the cooperating latch element 12.

As is apparent from the foregoing specification, the invention is susceptible of being embodied with various alterations and modifications which may differ particularly from those that have been described in the preceding specification and description. It should be understood that we wish to embody within the scope of the patent warranted hereon all such modifications as reasonably and properly come within the scope of our contribution to the art.

We claim as our invention:

1. The combination of a housing part and a retaining clip for fastening flat component parts to the housing part, comprising a clip having two legs formed at an angle therebetween, one leg engaging within a shaft-like receptacle in the housing part and being partially supported against a wall of the housing part, said one leg having a latch hook at its end which engages with a latch element which projects from the housing part into the receptacle, and the other leg thereof being seated against the flat component part under pre-tension.

2. A combination according to claim 1, wherein the angle between the two legs is less than 90°.

3. A combination according to claim 1, wherein the leg seated against the component part includes a shoulder in its end region facing the component part.

4. A combination according to claim 3, wherein the shoulder is integrally connected to the leg and includes a rounded contour at its free end.

5. A combination according to claim 1, wherein a reinforcing rib is arranged between the two legs in their connecting region.

6. A combination according to claim 1, wherein said latch hook end is accessible from the exterior of said housing to permit disengagement of said clip from said housing.

7. The combination of a housing part and a retaining clip for fastening flat component parts to the housing part, comprising a clip having two legs formed at an angle of less than 90° therebetween, one leg including a latch hook at its free end which is engagable, within a shaft-like receptacle in the housing part, with a latch element which projects from the housing part into the receptacle, and the other leg thereof including a shoulder integrally connected to the leg, the shoulder including a rounded contour at its free end, and a reinforcing rib arranged between the two legs in their connection region.

8. A combination according to claim 7, wherein said latch hook end is accessible from the exterior of said housing to permit disengagement of said clip from said housing.

* * * * *